US012805125B2

(12) United States Patent
(10) Patent No.: US 12,805,125 B2
(45) Date of Patent: Nov. 17, 2026

Zhu et al.

(54) DISPLAY PANEL AND DISPLAY DEVICE

(71) Applicants: Hefei Visionox Technology Co., Ltd., Hefei (CN); KunShan Go-Visionox Opto-Electronics Co., Ltd, Kunshan (CN)

(72) Inventors: Xuejing Zhu, Hefei (CN); Xiaoxi Sun, Hefei (CN); Bo Rao, Hefei (CN); Yuan Yao, Hefei (CN); Yu Jin, Hefei (CN)

(73) Assignees: Hefei Visionox Technology Co., Ltd., Hefei (CN); KunShan Go-Visionox Opto-Electronics Co., Ltd, Kunshan (CN)

( * ) Notice: Subject to any disclaimer, the term of this patent is extended or adjusted under 35 U.S.C. 154(b) by 326 days.

(21) Appl. No.: 18/738,294

(22) Filed: Jun. 10, 2024

(65) Prior Publication Data

US 2025/0126979 A1 Apr. 17, 2025

(30) Foreign Application Priority Data

Oct. 13, 2023 (CN) ........................ 202311330463.X

(51) Int. Cl.

*H10K 59/122* (2023.01)
*H10K 59/131* (2023.01)
*H10K 59/40* (2023.01)

(52) U.S. Cl.

CPC ....... *H10K 59/122* (2023.02); *H10K 59/1315* (2023.02); *H10K 59/40* (2023.02)

(58) Field of Classification Search

CPC .................................................... H05K 59/122

See application file for complete search history.

(56) References Cited

U.S. PATENT DOCUMENTS 11,327,610 B2 * 5/2022 Hwang ................... G06F 3/044
2010/0156273 A1 * 6/2010 Utsunomiya ...... H10K 59/1315 445/24

(Continued)

FOREIGN PATENT DOCUMENTS

CN 111584762 A 8/2020
CN 218938930 U 4/2023

(Continued)

OTHER PUBLICATIONS

Office Action issued on Sep. 2, 2025, in corresponding Japanese Application No. 2024-162347, 11 pages.

(Continued)

*Primary Examiner* — William A Harriston
(74) *Attorney, Agent, or Firm* — Maier & Maier, PLLC

(57) ABSTRACT

A display panel and a display device. The display panel includes a substrate, an isolation structure, a light-emitting functional layer, a first electrode layer and a light adjustment portion. The isolation structure is provided on a side of the substrate and includes a plurality of isolation units provided at intervals, and the isolation units encircle and form at least one opening structure. The light-emitting functional layer is provided on the side of the substrate and includes a light-emitting structure corresponding to the opening structure. The first electrode layer includes a first electrode corresponding to the opening structure. The light adjustment portion is provided on the side of the substrate, and an orthographic projection of the light adjustment portion on the substrate is at least partially positioned between orthographic projections of adjacent isolation units on the substrate.

20 Claims, 7 Drawing Sheets

(56) References Cited

U.S. PATENT DOCUMENTS

| | | | | |
|---|---|---|---|---|
| 2016/0148981 | A1* | 5/2016 | Matsueda | H10K 59/353<br>257/40 |
| 2017/0060302 | A1 | 3/2017 | Yang et al. | |
| 2019/0165068 | A1 | 5/2019 | Park et al. | |
| 2020/0343315 | A1 | 10/2020 | Lin et al. | |
| 2021/0004098 | A1* | 1/2021 | Hwang | G06F 3/044 |
| 2021/0333969 | A1 | 10/2021 | Zhao et al. | |
| 2022/0004275 | A1* | 1/2022 | Ma | G06F 3/0412 |

FOREIGN PATENT DOCUMENTS

| | | | |
|---|---|---|---|
| CN | 116207110 | A | 6/2023 |
| JP | 2005148475 | A | 6/2005 |
| JP | 2008135325 | A | 6/2008 |
| JP | 2018049254 | A | 3/2018 |
| JP | 2019504434 | A | 2/2019 |
| JP | 2019532362 | A | 11/2019 |
| JP | 2020167173 | A | 10/2020 |
| KR | 1020230035199 | A | 3/2023 |
| WO | 0178461 | A1 | 10/2001 |
| WO | 2019220896 | A1 | 11/2019 |

OTHER PUBLICATIONS

Office Action issued on Dec. 16, 2025, in corresponding Japanese Application No. 2024-162347, 6 pages.

Office Action issued on Jun. 20, 2025, in corresponding Korean Application No. 10-2024-0126630, 10 pages.

* cited by examiner

DISPLAY PANEL AND DISPLAY DEVICE

CROSS-REFERENCE TO RELATED APPLICATION

The present application is based upon and claims the priority to Chinese patent application No. 202311330463.X filed on Oct. 13, 2023, which is incorporated herein by reference in its entirety.

TECHNICAL FIELD

The present application relates to the technical field of display apparatus, and in particular, to a display panel and a display device.

BACKGROUND

Flat display panels such as organic light emitting diode (OLED) panels and display panels using light emitting diode (LED) devices are widely used in various consumer electronic products such as mobile phones, televisions, personal digital assistants, digital cameras, notebook computers, desktop computers and the like, due to their advantages of high image quality, power saving, thin body and wide application range etc., and have become mainstreams in display devices.

SUMMARY

Embodiments of the present application provide a display panel and a display device, which can improve the performance of the display panel.

In a first aspect, an embodiment of the present application provides a display panel including a substrate, an isolation structure, a light-emitting functional layer, a first electrode layer and a light adjustment portion, the isolation structure is provided on a side of the substrate and includes a plurality of isolation units provided at intervals, and the isolation units encircle and form at least one opening structure. The light-emitting functional layer is provided on the side of the substrate and includes a light-emitting structure corresponding to the opening structure.

In a second aspect, an embodiment of the present application provides a display device including the display panel according to any one of the above-mentioned embodiments.

In the display panel and display device provided by the embodiments of the present application, by patterning the isolation structure, the isolation structure can be divided into a plurality of insulated isolation units provided at intervals. In addition, since the light adjustment portion is added, which is mainly used to adjust ambient light, and by positioning the orthographic projection of the light adjustment portion on the substrate between the orthographic projections of the adjacent isolation units on the substrate, the light adjustment portion can adjust incident light between adjacent touch units, so that a display difference between a region where the isolation units are provided and a region without isolation units in the display panel is reduced, and thereby the performance of the display panel is improved.

BRIEF DESCRIPTION OF THE DRAWINGS

In order to illustrate technical solutions of embodiments of the present application more clearly, the drawings required for the embodiments of the present application will be briefly described. For a person skilled in the art, other drawings can also be obtained from these drawings without any inventive effort.

DESCRIPTION OF REFERENCE NUMERALS

10: Substrate;

20: Isolation structure; 21: Opening structure; 22: First isolation portion; 23: Second isolation portion; 24: Third isolation portion;

30: Light-emitting functional layer; 31: Light-emitting structure;

40: First electrode layer; 41: First electrode;

50: Second electrode layer; 51: Second electrode;

60: Light adjustment portion; 61: Shading portion;

71: First encapsulation layer; 711: First encapsulation portion; 72: Second encapsulation layer; 73: Third encapsulation layer;

80: Pixel definition layer; 81: Pixel definition portion; 82: Pixel opening;

90: Protection layer;

IC: Driving chip;

D1: Isolation unit; D2: Touch unit;

Z1: Connection line; Z2: Reflective portion;

X: Thickness direction.

DETAILED DESCRIPTION

Features and exemplary embodiments of various aspects of the present application will be described in details below. In order to make the objects, aspects and advantages of the present application more apparent, the present application will be described in further details below with reference to the accompanying drawings and specific embodiments. It should be understood that the specific embodiments described herein are illustrative only and are not restrictive.

It will be apparent to those skilled in the art that the present application may be practiced without some of these specific details. The following description of embodiments is only intended to provide a better understanding of the application by illustrating examples of the present application.

It is to be noted that relation terms such as first and second etc., are only used herein to distinguish one entity or action from another entity or action without necessarily requiring or implying any actual such relationship or order between such entities or actions. Furthermore, the terms "including", "comprising", or any other variation thereof, are intended to cover a non-exclusive inclusion, so that a process, method, article, or apparatus that includes a list of elements does not include only those elements but may include other elements not expressly listed or inherent to such process, method, article, or apparatus. Without more constraints, an element proceeded by a phrase "include . . . " does not preclude the existence of additional identical elements in the process, method, article, or apparatus that includes the element.

With the development of information technology, a demand for smart, light, thin and swift display devices is increasing. Display devices such as mobile phones and computers etc. should not only meet the need for display, but also meet the need for touching, so as to meet the demand for diversity of the display devices. In view of this, how to achieve the integration of touch function into a display device has become a research direction of many manufacturers.

Figure 1:
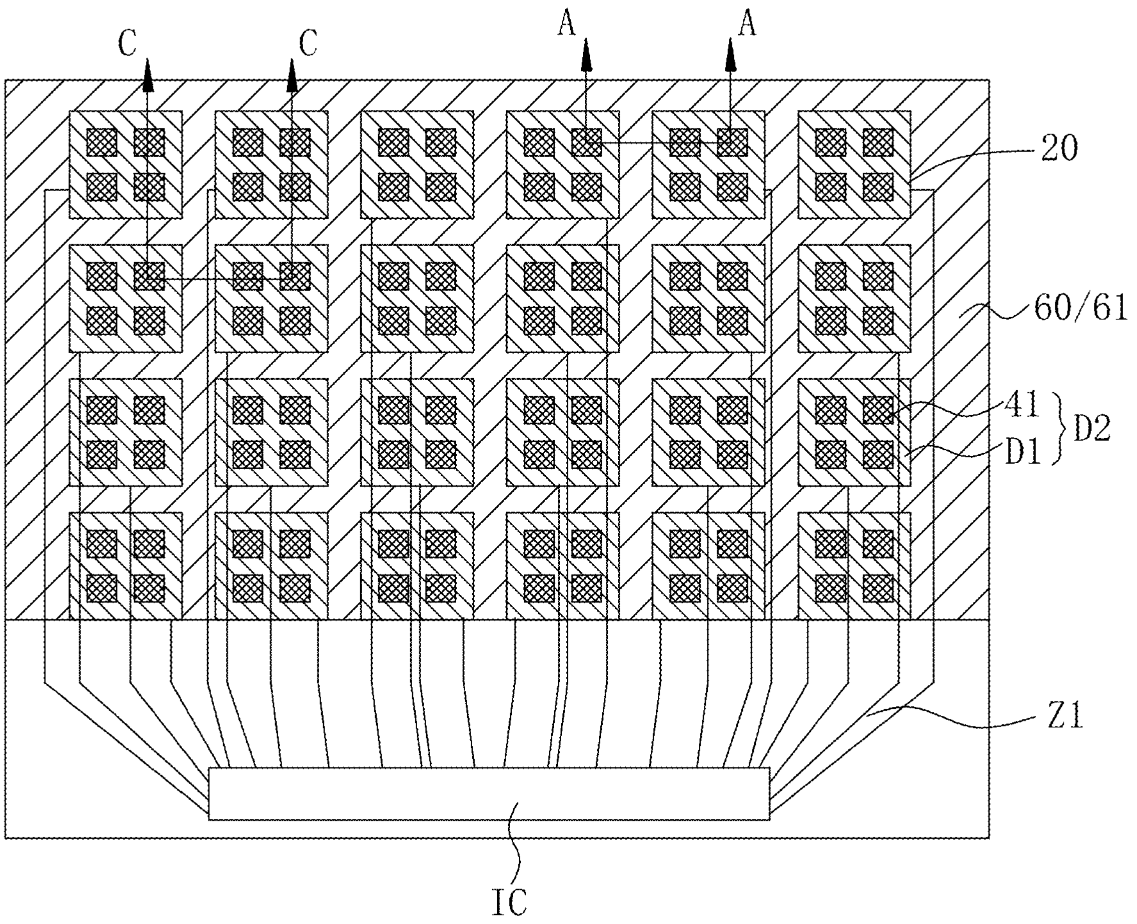
FIG. 1 is a schematic structural diagram of a display panel according to an embodiment of the present application.
Figure 2:
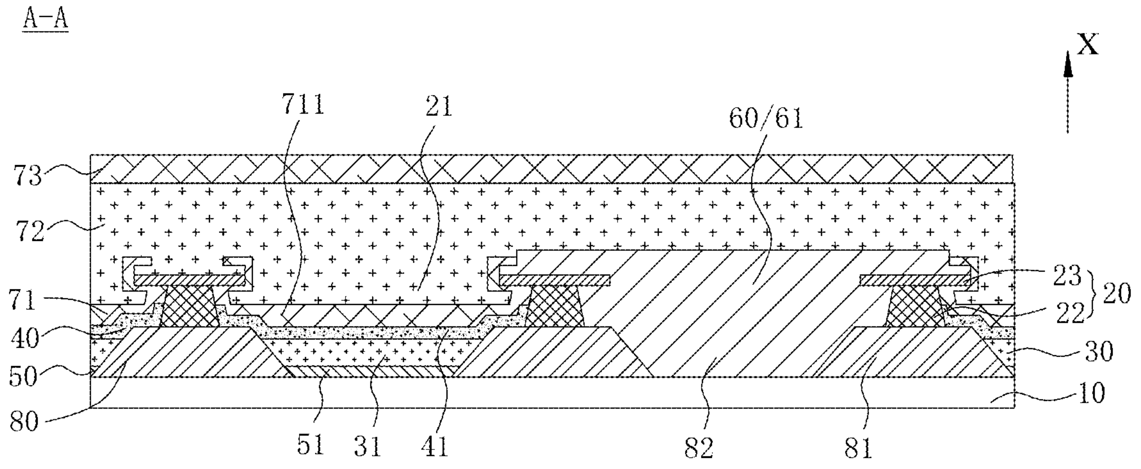
FIG. 2 is a schematic structural diagram of a sectional view at A-A in FIG. 1.

In a first aspect, as shown in FIG. 1 and FIG. 2, an embodiment of the present application provides a display panel including a substrate 10, an isolation structure 20, a light-emitting functional layer 30, a first electrode layer 40 and a light adjustment portion 60, the isolation structure 20 is provided on a side of the substrate 10 and includes a plurality of isolation units D1 provided at intervals, and the isolation units D1 encircle and form at least one opening structure 21. The light-emitting functional layer 30 is provided on the side of the substrate 10 and includes a light-emitting structure 31 corresponding to the opening structure 21.

The first electrode layer 40 is provided on a side of the light-emitting functional layer 30 facing away from the substrate 10 and includes a first electrode 41 corresponding to the opening structure 21. The light adjustment portion 60 is provided on the side of the substrate 10, and an orthographic projection of the light adjustment portion 60 on the substrate 10 is at least partially positioned between orthographic projections of adjacent isolation units D1 on the substrate 10.

The substrate 10 is mainly plays a supporting and bearing role, and other film layers are stacked in sequence on the substrate 10. The stacked arrangement mentioned herein means that the other film layers are provided in sequence along a thickness direction X of the substrate 10, and the substrate 10 may include a plurality of film layers. Specific structures of the film layers are not limited herein. In addition, the thickness direction X of the other film layers positioned on a side of the substrate 10 is generally consistent with the thickness direction X of the substrate 10, and thus, for the convenience of description, the thickness direction X of the substrate 10 or the thickness direction X of the other film layers mentioned subsequently in the embodiments of the present application are both shown as the same direction.

The light-emitting functional layer 30 and the isolation structure 20 are positioned on the same side of the substrate 10, and the light-emitting functional layer 30 includes the light-emitting structure 31 provided correspondingly to the opening structure 21. "The light-emitting structure 31 provided correspondingly to the opening structure 21" mentioned herein means that an orthographic projection of the light-emitting structure 31 on the substrate 10 is at least partially positioned within an orthographic projection of the opening structure 21 on the substrate 10. The light-emitting structure 31 may be positioned within the opening structure 21 or may be positioned on a side of the opening structure 21 facing the substrate 10, which is not limited in the embodiments of the present application.

The light-emitting structure 31 includes, but is not limited to, a red light-emitting structure 31 configured to emit red light, a green light-emitting structure 31 configured to emit green light, and a blue light-emitting structure 31 configured to emit blue light. Each light-emitting structure 31 may include a Hole Inject Layer (HIL), a Hole Transport Layer (HTL), a light-emitting layer, an Electron Inject Layer (EIL), and an Electron Transport Layer (ETL) arranged in a stack.

The first electrode layer 40 is positioned on a side of the light-emitting functional layer 30 facing away from the substrate 10, and similarly to the light-emitting functional layer 30, the first electrode layer 40 also includes a plurality of first electrodes 41 provided correspondingly to opening structures 21, that is, an orthographic projection of a first electrode 41 on the substrate 10 is at least partially positioned within an orthographic projection of a corresponding opening structure 21 on the substrate 10. Optionally, the display panel further includes a second electrode layer 50 positioned on a side of the light-emitting functional layer 30 facing the substrate 10, and the second electrode layer 50 is provided with second electrode(s) 51. There may be a plurality of second electrodes 51 that are arranged correspondingly to the light-emitting structures 31. The first electrode(s) 41 and the second electrode(s) 51 jointly drive and control whether the light-emitting structure(s) 31 emit light or not. Illustratively, the first electrode(s) 41 are cathode(s) and the second electrode(s) 51 are anode(s).

The isolation structure 20 includes a plurality of isolation units D1 provided at intervals, and there is a certain distance between different isolation units D1 so as to insulate different isolation units D1 from each other. Further, the isolation units D1 encircle and form at least one opening structure 21, the light-emitting structures 31 and the first electrodes 41 may be provided correspondingly to the opening structures 21, and the isolation structure 20 is provided, so that the plurality of light-emitting structures 31 provided at intervals may be formed on the light-emitting functional layer 30 without requiring a fine metal mask.

Specifically, the red light-emitting structure 31 before the preparation of the green light-emitting structure 31 is taken as an example. Since the fine metal mask is eliminated, a red light-emitting material corresponding to the red light-emitting structure 31 firstly falls into the respective opening structures 21, and then a part of the red light-emitting material in the opening structures 21 is selectively etched away and the other part of the red light-emitting material in the opening structures 21 remains to form the red light-emitting structure 31. After that, a green light-emitting material corresponding to the green light-emitting structure 31 falls into the respective opening structures 21, and then a part of the green light-emitting material in the opening structure 21 is selectively etched away and the other part of the green light-emitting material in the opening structure 21 remains to form the green light-emitting structure 31.

Similarly, due to the presence of the isolation structure 20, the first electrode layer 40 may further include the plurality of first electrodes 41 provided correspondingly to opening structures 21, that is, the plurality of first electrodes 41 may be provided correspondingly to the plurality of light-emitting structures 31, so as to achieve drive control of the light-emitting structures 31. For a plurality of opening structures 21 encircled and formed by the same isolation unit D1, a plurality of first electrodes 41 provided correspondingly to the plurality of opening structures 21 are electrically connected to the isolation unit D1.

On this basis, in some embodiments, a conductive material may be provided in the isolation unit D1, and the first electrode(s) 41 may be in contact with and electrically connected to a corresponding isolation unit D1, so that the isolation unit D1 and one or more first electrodes 41 corresponding to the isolation unit D1 together can constitute a touch unit D2. For example, a plurality of first electrodes 41 electrically connected to the same isolation unit D1 and the isolation unit D1 form a touch unit D2. In other words, in addition to achieving the drive control over the light-emitting structures 31, the first electrodes 41 can also constitute the touch unit D2 for achieving a touch function.

Specifically, since the isolation unit D1 may be in contact with and electrically connected to the first electrode(s) 41, during the use of the display panel, a control module such as a driving chip IC can deliver a power signal to the isolation unit D1 in certain durations and regions, and the isolation unit D1 transmits a corresponding power signal to the first electrode(s) 41 so as to enable the first electrode(s) 41 to drive the light-emitting structure(s) 31 to emit light. In some other durations and regions, the driving chip IC can transmit a specific touch signal to the touch unit D2 formed by the first electrode(s) 41 and the isolation unit D1, so that the display panel can achieve the touch function. That is, the driving chip IC can deliver a power signal or a touch signal to the first electrodes 41 in different durations and regions, so that the display panel can achieve both a display function and a touch function, and achieve time-divided and region-divided control of the display function and the touch function.

In some embodiments, a isolation unit D1 and at least one first electrode electrically connected to the isolation unit D1 form a touch unit D2, and adjacent touch units D2 are provided at intervals.

It should be noted that the touch function achieved by a plurality of touch units D2 in the present embodiment may be a self-capacitive touch function.

In the above embodiment, the isolation unit D1 and the first electrode(s) 41 may be reused as a touch unit, and in another embodiment, a plurality of isolation units D1 provided at intervals can achieve independent control over the first electrode(s) 41. For example, first electrodes 41 electrically connected to the same isolation unit D1 have the same voltage, and first electrodes 41 electrically connected to different isolation units D1 have different voltages, so that first electrodes 41 in different regions may have different voltages, thereby achieving region-divided independent control over the first electrodes 41.

In the embodiments of the present application, by patterning the isolation structure 20, the isolation structure 20 can be divided into a plurality of insulated isolation units D1 provided at intervals. On this basis, the isolation unit D1 and corresponding first electrode(s) 41 together can constitute the touch unit D2. By delivering different types of signals to first electrodes 41 in different durations and regions, the display panel can achieve time-divided and region-divided control of the display function and the touch function without requiring an additional touch layer, which is helpful to reduce an overall thickness of the display panel and facilitates the light and thin design of the display panel.

However, since there is a certain distance between respective isolation units D1, the display panel may include a region where the isolation units D1 are provided and a region without isolation units D1. Both the regions are often provided with reflective materials, and the reflective materials are distributed in some different ways, which tends to cause differences in light reflectivity corresponding to different regions of the display panel, and thereby leads to a risk that patterns of the isolating structures 20 are visible when a screen of the display panel is turned off.

In view of this, in the embodiments of the present application, the light adjustment portion 60 is added and mainly plays a role for compensating, adjusting, absorbing or shading ambient light, and by positioning the orthographic projection of the light adjustment portion 60 on the substrate 10 between the orthographic projections of adjacent isolation units D1 on the substrate 10, the light adjustment portion 60 can adjust incident light between the adjacent touch units D2, for example, the light adjustment portion 60 absorbs, shades or reflects the incident light, and whether the light adjustment portion 60 absorbs, shades or reflects the incident light may be determined based on whether the isolation unit(s) D1 absorb or reflect the incident light. Therefore, the difference in light between the region where the isolation units D1 are provided and the region without isolation units D1 in the display panel can be reduced, and the performance of the display panel can be improved.

It should be noted that the light adjustment portion 60 may be provided in various manners. The light adjustment portion 60 can shade light by absorbing at least a part of the light. Alternatively, the light adjustment portion 60 may adjust the light reflectivity of the display panel at corresponding positions by using materials such as metal or the like, so that differences in the light reflectivity at different positions can be reduced, and thus the light is compensated and adjusted.

In addition, the light adjustment portion 60 may be provided in various positions. For example, at least a part of the light adjustment portion 60 may be positioned on a side of the isolation structure 20 facing away from the substrate 10, or at least a part of the light adjustment portion 60 may be positioned on the same film layer as the isolation structure 20, or at least a part of the light adjustment portion 60 may be positioned on a side of the isolation structure 20 facing the substrate 10, which is not limited in the embodiments of the present application.

In some embodiments, the isolation units D1 and the light adjustment portion 60 both include shading materials, or the isolation units D1 and the light adjustment portion 60 both include reflective materials. In this way, each gap between adjacent isolation units D1 has a shading property or a reflective property, the difference between the region where the isolation units D1 are provided and the region without isolation units D1 in the display panel is reduced, and the risk that the patterns of the isolating structures 20 are visible when the screen of the display panel is turned off is reduced.

In some embodiments, as shown in FIG. 1 and FIG. 2, the isolation structure 20 includes a first isolation portion 22 and a second isolation portion 23 stacked in sequence along a direction away from the substrate 10, an orthographic projection of the first isolation portion 22 on the substrate 10 is positioned within an orthographic projection of the second isolation portion 23 on the substrate 10.

Specific sizes and shapes of the first isolation portion 22 and the second isolation portion 23 are not limited in the embodiments of the present application. In an example, a longitudinal cross-section of the insulation structure 20 may be I-shaped, T-shaped, or inverted trapezoidal. This design is helpful to partition the light-emitting material and electrode material at edges of the isolation structure 20 during manufacturing of the light-emitting functional layer 30 and the first electrode layer 40, so that light-emitting structures 31 and the first electrodes 41 corresponding to different opening structures 21 are manufactured and separated from each other without requiring a fine metal mask.

Materials in the first isolation portion 22 and the second isolation portion 23 are not limited in the embodiments of the present application. The first isolation portion 22 and the second isolation portion 23 may both include conductive materials, or the first isolation portion 22 includes a conductive material while the second isolation portion 23 includes an insulation material, as long as the first electrodes 41 can achieve signal transmission by means of at least one of the first isolation portion 22 and the second isolation portion 23.

In some embodiments, the first isolation portion 22 includes a conductive material, and the first electrode 41 is electrically connected to the first isolation portion 22.

The first electrode 41 is electrically connected to the first isolation portion 22. The first electrode 41 may be in direct contact with the first isolation portion 22, or the first electrode 41 may be electrically connected to the first isolation portion 22 through another conductive structure, which is not limited in the embodiments of the present application.

In the embodiments of the present application, by providing the conductive material in the first isolation portion 22, the display panel can achieve transmission of the power signal to the first electrode(s) 41 through the first isolation portion 22, thereby meeting the need of signal transmission, which is helpful for time-divided and region divided touch and display drive in the display panel.

Figure 3:
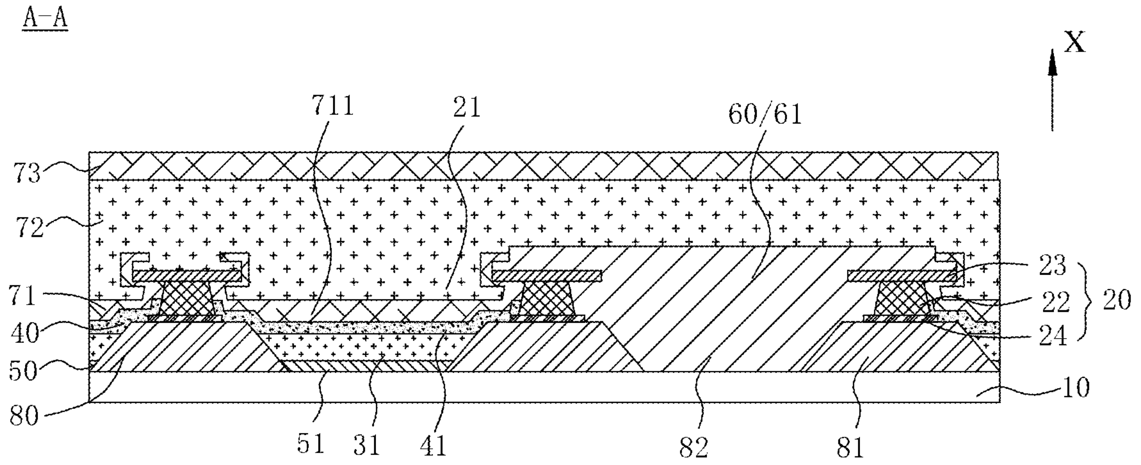
FIG. 3 is a schematic structural diagram of a sectional view at A-A of another display panel according to an embodiment of the present application.

In some embodiments, as shown in FIG. 1 and FIG. 3, the isolation structure 20 further includes a third isolation portion 24 positioned on a side of the first isolation portion 22 facing the substrate 10, and the third isolation portion 24 includes a conductive material and is electrically connected to the first isolation portion 22.

In the thickness direction X, the isolation structure 20 includes at least the first isolation portion 22, the second isolation portion 23 and the third isolation portion 24, and sizes and shapes of the first isolation portion 22, the second isolation portion 23 and the third isolation portion 24 are not limited in the embodiments of the present application. Illustratively, the orthographic projection of the first isolation portion 22 on the substrate 10 is positioned within an orthographic projection of the third isolation portion 24 on the substrate 10, that is, longitudinal cross-sections of the first isolation portion 22, the second isolation portion 23 and the third isolation portion 24 are I-shaped.

Similarly to the first isolation portion 22, the third isolation portion 24 also includes a conductive material, and the first electrode 41 may be in direct contact with the third isolation portion 24, so that the first electrode 41 is electrically connected to the first isolation portion 22 through the third isolation portion 24. Optionally, the first electrode 41 is overlapped with the third isolation portion 24. Further, the first electrode 41 may be partially positioned on a side of the third isolation portion 24 facing away from the substrate 10, and the third isolation portion 24 is helpful to improve the reliability of the electrical connection between the first electrode 41 and the isolation structure 20.

In some embodiments, as shown in FIG. 1 and FIG. 2, the display panel further includes a plurality of connection lines Z1, and at least some different ones of the connection lines Z1 are electrically connected to different isolation units D1.

Each connection line Z1 is electrically connected to an isolation unit D1 to transmit a touch signal to a touch unit D2 in a specific duration and region, or transmit a power signal to a first electrode 41 in the touch unit D2 in the specific duration and region, so as to achieve time-divided and region-divided display and touch control in the display panel. The connection line Z1 may be in contact with a first isolation portion 22 in the isolation unit D1, or the connection line Z1 may be in contact with a second isolation portion 23 in the isolation unit D1, or the connection line Z1 may be in contact with a third isolation portions 24 in the isolation unit D1, as long as the connection line Z1 may be in contact with a structure in the touch unit D2 for an electrical connection to the first electrode 41. For example, the connection line Z1 may be in contact with the isolation structure 20. In some optional embodiments, the connection line Z1 is in contact with the first isolation portion 22. Alternatively, in some other optional embodiments, the connection line Z1 is in contact with the first isolation portion 23.

In the embodiments of the present application, at least some different ones of the connection lines Z1 are electrically connected to different isolation units D1, so that different power signals or touch signals can be delivered to different isolation units D1 through different connection lines Z1 during a display process or a touch process, thereby achieving the region-based control over the display function and the touch function, and improving the display accuracy or touch accuracy of the display panel.

It should be noted that one isolation unit D1 may correspond to one connection line Z1 or a plurality of connection lines Z1, and different isolation units D1 may correspond to the same number of connection line(s) Z1 or different numbers of connection line(s) Z1, which is not limited in the embodiments of the present application.

Figure 4:
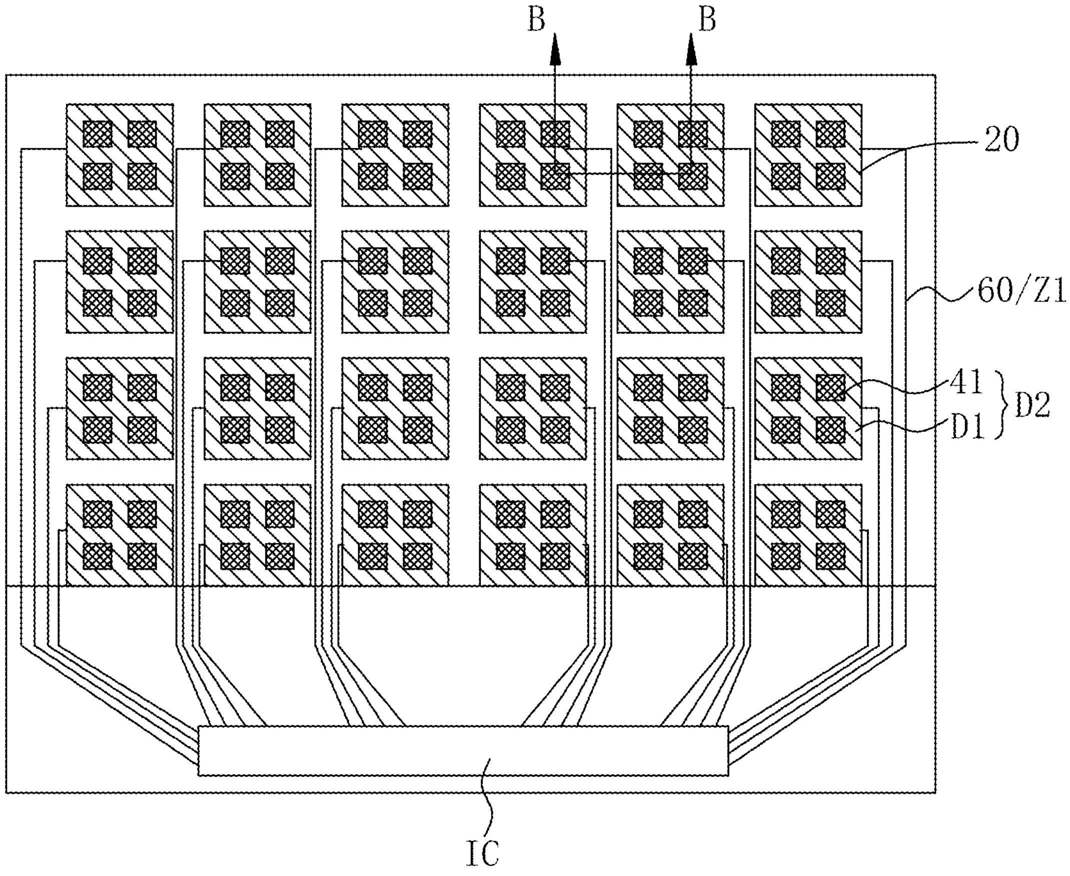
FIG. 4 is a schematic structural diagram of another display panel according to an embodiment of the present application.
Figure 5:
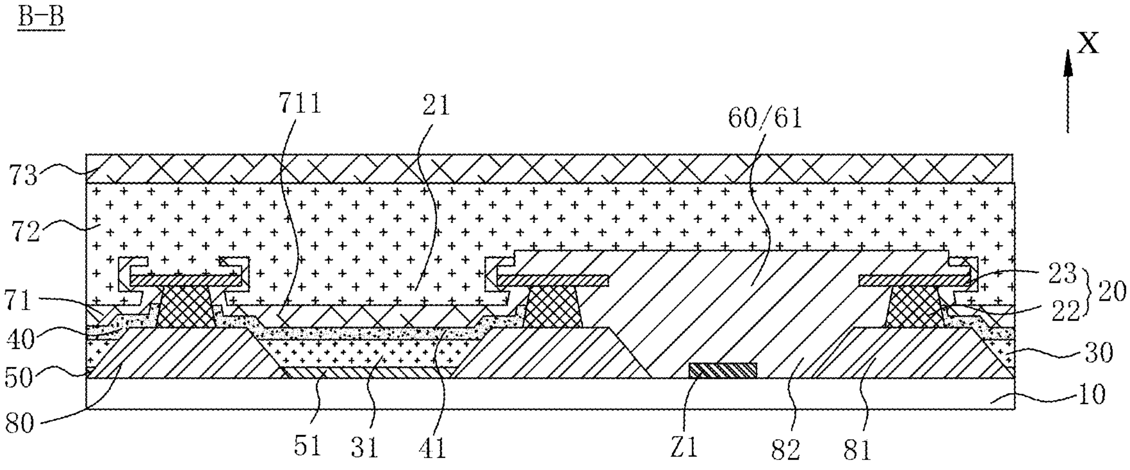
FIG. 5 is a schematic structural diagram of a sectional view at B-B in FIG. 4.

In addition, the layout and design of the connection lines Z1 in the display panel is not limited in the embodiments of the present application. In some optional embodiments, as shown in FIG. 4 and FIG. 5, the light adjustment portion 60 includes at least parts of the connection lines Z1, and orthographic projections of at least parts of the connection lines Z1 on the substrate 10 are positioned between the adjacent isolation units D1.

The orthographic projections of at least parts of the connection lines Z1 on the substrate 10 are positioned between orthographic projections of connected isolation units D1 on the substrate 10, so that at least parts of the connection lines Z1 may be reused as the light adjustment portion 60. Specifically, the connection lines Z1 may include metal materials such as copper, aluminium and titanium etc., and the orthographic projections of at least parts of the connection lines Z1 on the substrate 10 are positioned between the orthographic projections of the adjacent isolation units D1 on the substrate 10, so that the light reflectivity corresponding to the regions between adjacent touch units D2 in the display panel can be adjusted by means of the connection lines Z1, thereby reducing differences in the light reflectivity corresponding to different regions, which is helpful to reduce the risk that the isolation units D1 are visible under a condition that the screen of the display panel is turned off.

Furthermore, in the embodiments of the present application, an adjustment of light in the regions of the display panel between adjacent isolation units D1 can be achieved by means of the connection lines Z1, so that the display uniformity can be improved without requiring additional metal materials, which is helpful to reduce the manufacturing cost of the display panel. Meanwhile, at least parts of the connection lines Z1 can be provided in a manner to keep clear of the light-emitting structures 31, thereby improving the display effect of the display panel.

Specific positions of the connection lines Z1 (the orthographic projections of the connection lines Z1 are positioned between adjacent isolation units D1) are not limited in the embodiments of the present application. Illustratively, the connection lines Z1 (the orthographic projections of the connection lines Z1 are positioned between adjacent isolation units D1) may be provided on a side of the isolation structures 20 facing away from the substrate 10, or may be provided on a side of the light-emitting functional layer 30 facing the substrate 10.

In some embodiments, orthographic projections of at least parts of the connection lines Z1 on the substrate 10 overlap orthographic projections of the isolation units D1 on the substrate 10, that is, at least parts of the connection lines Z1 are provided on a side of the isolation units D1 facing away from the substrate 10.

In the embodiments of the present application, since at least some of the connection lines Z1 are provided correspondingly to the isolation units D1, the connection lines Z1 may extend along the isolation units D1, so that orthographic projections of the connection lines Z1 on the substrate 10 and orthographic projections of the light-emitting structures 31 on the substrate 10 are staggered, and thereby the impact of the connection lines Z1 on the light emitted by the light-emitting structures 31 can be reduced, and the display effect of the display panel can be improved.

Figure 6:
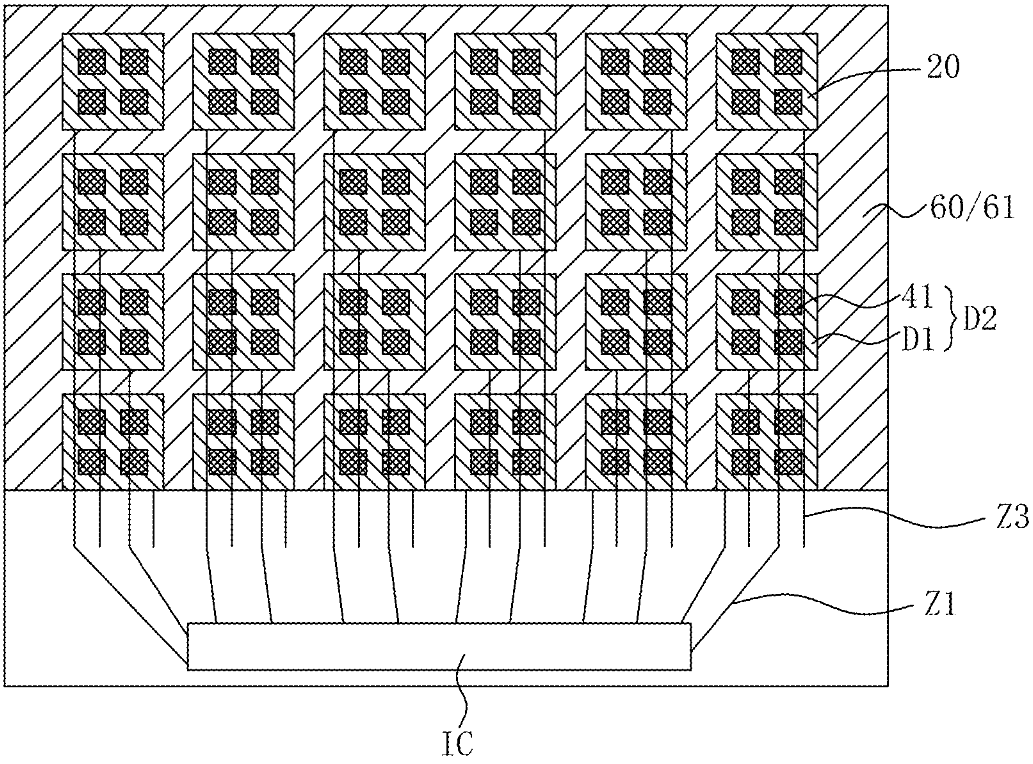
FIG. 6 is a schematic structural diagram of another display panel according to an embodiment of the present application.

In some embodiments, as shown in FIG. 6, the display panel further includes dummy lines Z3 provided side by side with and insulated from the connection lines Z1, and among the plurality of connection lines Z1 and the dummy lines Z3 provided side by side, a distance between any two adjacent lines is identical.

The dummy lines Z3 may include the same material as the connection lines Z1, but the dummy lines Z3 differ from the connection lines Z1 in that the dummy lines Z3 are not electrically connected to the isolation units D1, so that the dummy lines Z3 are insulated from the connection lines Z2. Further, the dummy lines Z3 may not be electrically connected to any other signals, that is, the dummy lines Z3 do not transmit any signal.

The dummy lines Z3 may be interposed between the plurality of connection lines Z1, and the dummy lines Z3 may extend along the same direction as the connection lines Z1, so that the dummy lines Z3 and the connection lines Z1 may be provided side by side. On this basis, among the plurality of connection lines Z1 and the dummy lines Z3 provided side by side, a distance between any two adjacent lines is identical. The "any two adjacent lines" mentioned herein may be two connection lines Z1, or may be one connection line Z1 and one dummy line Z3, or may be two dummy lines Z3, as long as there are no other connection line or dummy line Z3 between the two lines.

In the embodiments of the present application, by providing the dummy lines Z3 in the display panel, and by providing the plurality of connection lines Z1 and the dummy lines Z3 side by side and setting a distance between any two adjacent lines to be identical, arrangement densities of conductor materials constituting the connection lines Z1 and the dummy lines Z3 in different regions of the display panel are the same, so as to reduce differences in the light reflectivity corresponding to different regions, which is helpful to reduce the risk that the isolation units D1 are visible under a condition that the screen of the display panel is turned off.

It should be noted that in FIG. 6, orthographic projections of the connection lines Z1 and the dummy lines Z3 on the substrate may overlap the light-emitting structures, and on this basis, in order to reduce the impact of the connection lines Z1 and the dummy lines Z3 on the light-emitting effect, the connection lines Z1 and the dummy lines Z3 may be provided on a side of the light-emitting structures facing the substrate. In addition, positions of the connection lines Z1 and the dummy lines Z3 may be adjusted, so that the orthographic projections of the connection lines Z1 and the dummy lines Z3 on the substrate do not overlap the light-emitting structures.

Types of signals transmitted in the connection lines Z1 are not limited in the embodiments of the present application. Optionally, the connection lines Z1 include power signal lines used to provide power signals to the first electrodes 41 so as to control whether the light-emitting structures 31 emit light or not. Optionally, in some embodiments, each first electrode 41 is electrically connected to a corresponding isolation unit D1 to form a touch unit D2, and the connection lines Z1 include touch signal lines. The touch signal lines are used to provide touch signals to the touch units D2 so as to achieve the touch function of the display panel.

Each isolation unit D1 includes a light-transmitting material and/or a reflective material. Materials of the first isolation portion 22 and the second isolation portion 23 are not limited in the embodiments of the present application, and optionally, the first isolation portion includes a light-transmitting material or a reflective material, and/or the second isolation portion includes a light-transmitting material or reflective material. In some specific embodiments, the first isolation portion 22 includes a reflective material, and the second isolation portion 23 includes a light-transmitting material, for example, the material of the first isolation portion 22 is aluminium, and the material of the second isolation portion 23 is a light-transmitting metal oxide; alternatively, the first isolation portion 22 and the second isolation portion 23 both include reflective materials, for example, the material of the first isolation portion 22 is aluminium, and the material of the second isolation portion 23 is titanium.

In some embodiments, as shown in FIG. 1 and FIG. 2, the light adjustment portion 60 includes a shading portion 61, and an orthographic projection of at least a partial structure of the shading portion 61 is positioned between orthographic projections of adjacent isolation units D1 on the substrate 10.

The shading portion 61 may include a shading material. Optionally, the shading material may be a black material, and specific components of the shading portion 61 are not limited in embodiments of the present application. Illustratively, the shading portion 61 includes an organic material. Preferably, the shading portion 61 includes the shading material.

In the embodiments of the present application, by positioning the orthographic projection of at least the partial structure of the shading portion 61 between the orthographic projections of the adjacent isolation units D1 on the substrate 10, incident light to positions between the adjacent isolation units D1 on the display panel can be absorbed by means of the shading portion 61, which is also helpful to improve the uniformity of the display panel.

A specific position of the shading portion 61 in the display panel is not limited in the embodiments of the present application. Optionally, at least a part of the shading portion 61 is positioned on the same film layer as the isolation structure 20, for example, at least a part of the shading portion 61 is positioned on the same film layer as the first isolation portion 22, that is, at least a part of the shading portion 61 may be filled between first isolation portions 22 corresponding to adjacent isolation units D1, so that the shading portion 61 may be filled in a gap formed by the adjacent isolation units D1, which is helpful to the manufacturing of subsequent film layers.

In some embodiments, the display panel further includes a plurality of connection lines Z1, at least some different ones of the connection lines Z1 are electrically connected to different isolation units D1, and at least some of the connection lines Z1 are positioned on a side of the shading portion 61 facing the substrate 10.

In the embodiments of the present application, at least some of the connection lines Z1 are positioned on a side of the shading portion 61 facing the substrate 10, and under this condition, at least some of the connection lines Z1 may be provided on the same layer as the conductive material in the display panel, and materials of at least some of the connection lines Z1 may be the same as the conductive material, thereby improving the manufacturing efficiency of the display panel.

Alternatively, in some other embodiments, at least a part of the shading portion 61 is positioned on a side of the isolation structure 20 facing away from the substrate 10, that is, at least a part of the shading portion 61 is positioned on a side of the second isolation portions 23 facing away from the substrate 10.

In the embodiments of the present application, by positioning at least a part of the shading portion 61 on the side of the second isolation portions 23 facing away from the substrate 10, the shading portion 61 can cover at least a partial structure of the second isolation portions 23, and it is thus required the shading portion 61 to extend beyond the side of the second isolation portions 23 facing away from the substrate 10 during the manufacturing of the shading portion 61, so that the shading portion 61 can be better filled between adjacent isolation units D1, and a shading effect of the shading portion 61 on regions between adjacent touch units D2 can be further improved.

It should be noted that under a condition that the second isolation portion 23 includes a black material, the light adjustment portion 60 may include the shading portion 61, that is, the shading portion 61 may be positioned between orthographic projections of adjacent isolation units D1 on the substrate 10. At least a part of ambient light is absorbed by means of the shading portion 61, so that the risk that the isolation units D1 are visible under a condition that the screen of the display panel is turned off can be reduced.

In some optional embodiments, at least a part of the shading portion 61 is positioned on a side of the isolation structure 20 facing away from the substrate 10, and an orthographic projection of the shading portion 61 on the substrate 10 overlaps orthographic projections of the isolation structures 20 on the substrate 10. This design enables the shading portion 61 to be positioned at both a position where the isolation structure 20 is positioned and gaps between adjacent isolation units D1, thereby further reducing differences in different regions and reducing the risk that the isolation units D1 are visible under a condition that the screen of the display panel is turned off.

Optionally, the orthographic projection of the shading portion 61 on the substrate 10 covers the orthographic projections of the isolation structures 20 on the substrate 10. For example, under a condition that the isolation structures 20 do not have a shading function, the orthographic projection of the shading portion 61 on the substrate 10 covers the orthographic projections of the isolation structures 20 on the substrate 10, that is, the upper surfaces of the isolation structures 20 are covered by the shading portion 61, so that a region where the isolation structures 20 are provided and a region without isolation structures 20 have the same effect on light.

Optionally, under a condition that the isolation structures 20 have the shading function, the shading portion 61 may be provided only at the gaps between the adjacent isolation units D1, and the upper surfaces of the isolation structures 20 may not be covered by the shading portion 61.

Optionally, under a condition that the second isolation portion 23 or the first isolation portion 22 includes the reflective material, the light adjustment portion 60 may include at least some of the connection lines Z1 or other structures that may be capable of reflecting light, that is, at least some of the connection lines Z1 may be positioned between the orthographic projections of the adjacent isolation units D1 on the substrate 10. The light reflectivity corresponding to regions in the display panel between the adjacent isolation units D1 can be adjusted by means of the connection lines Z1, so as to reduce differences in light reflectivity corresponding to different regions, which is helpful to reduce the risk that the isolation units D1 are visible under a condition that the screen of the display panel is turned off.

Figure 7:
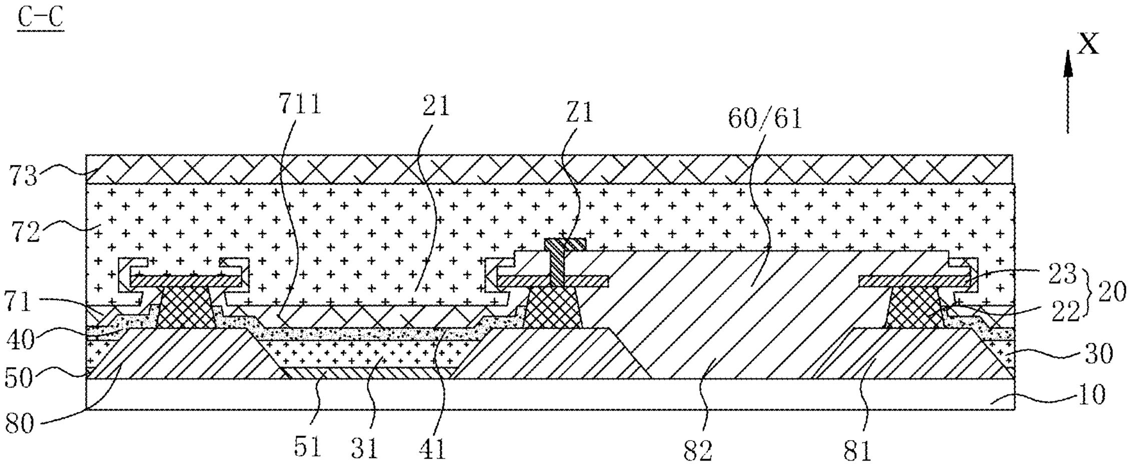
FIG. 7 is a schematic structural diagram of a sectional view at C-C in FIG. 1.

In some embodiments, as shown in FIG. 7, at least some of the connection lines Z1 are positioned on a side of the shading portion 61 facing away from the substrate 10.

In the embodiments of the present application, at least some of the connection lines Z1 may be positioned on the side of the shading portion 61 facing away from the substrate 10, so that the connection lines Z1 may be formed after the isolation structures 20 and the shading portion 61 are manufactured. Compared to the solution in which the connection lines Z1 are positioned on the side of the isolation structures 20 facing the substrate 10, under this design, the connection lines Z1 do not occupy any space on the side of the isolation structures 20 facing the substrate 10, that is, the connection lines Z1 will not be provided on the same layer as other routing structures on the side of the isolation structures 20 facing the substrate 10, thereby reducing the risk of an excessively small distance between adjacent lines, reducing the line density, and improving the transmission reliability of a routing signal within the display panel.

It should be noted that there is a need for the connection lines Z1 to be in contact with some structures in the isolation units D1 so as to meet the need for signal transmission, and on this basis, the connection lines Z1 may be in contact with the isolation units D1 in various manners, which is not limited in the embodiments of the present application. In some optional embodiments, the shading portion 61 includes a first via thereon, and at least some of the connection lines Z1 are connected to the isolation units D1 through the first via.

The presence of the first via can enable the connection lines Z1 to be in contact with the isolation units D1. The first via may extend through the shading portion 61 along the thickness direction X, and the connection lines Z1 can contact the isolation units D1 through the first via, thereby meeting the need for signal transmission to the isolation units D1 and the first electrodes 41, and achieving time-divided and region-divided driving of the display function and touch function of the display panel.

Further, in some embodiments, the second isolation portion 23 includes a second via provided thereon, the second via is connected to the first via, and at least some of the connection lines Z1 are electrically connected to the first isolation portion 22 through the first via and the second via.

It may be seen from the foregoing that the first isolation portion 22 may include the conductive material and the second isolation portion 23 may include the insulation material, and on this basis, in order to meet the need for signal transmission, there is a need for the connection lines Z1 to be in contact with the first isolation portions 22. In view of this, in the embodiments of the present application, each isolation unit D1 may be further provided with a second via, and each connection line Z1 can be in contact with and connected to a first isolation portion 22 through the first via and the second via, so as to meet the need for signal transmission to a corresponding isolation unit D1 and a corresponding first electrode 41, and achieve time-divided and region-divided driving of the display function and touch function of the display panel.

Figure 8:
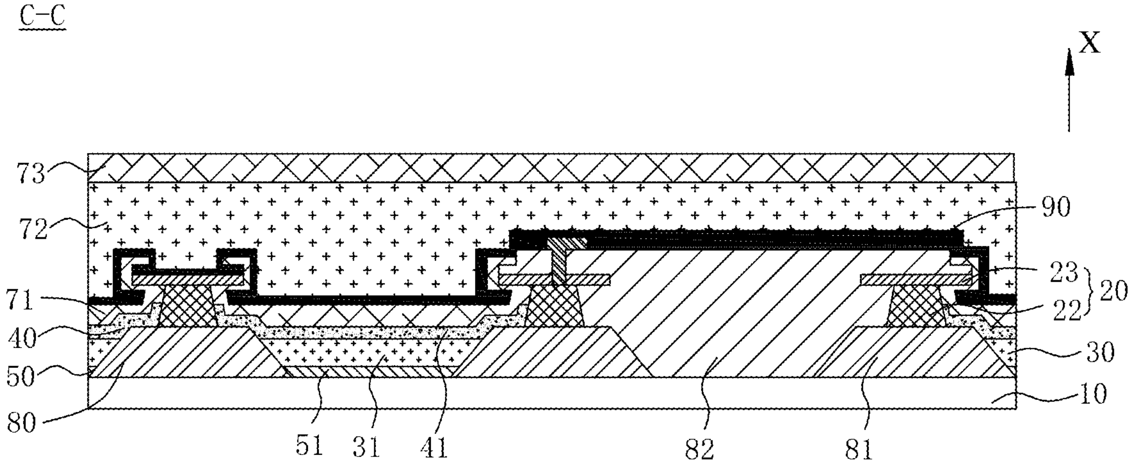
FIG. 8 is a schematic structural diagram of a sectional view at C-C of another display panel according to an embodiment of the present application.

In some embodiments, as shown in FIG. 8, the display panel further includes a protection layer 90 positioned on a side of the connection lines Z1 facing away from the substrate 10.

The protection layer 90 covers the connection lines Z1, and the presence of the protection layer 90 can play a certain shading role, thereby reducing the influence of other film layers in the display panel on the connection lines Z1 and improving the reliability of signal transmission in the connection lines Z1. The protection layer 90 may be provided in various manners, for example, the protection layer 90 may include a plurality of protection portions provided at intervals, and the plurality of protection portions are provided correspondingly to the plurality of connection lines Z1 so as to achieve separate protection for different connection lines Z1.

Alternatively, in some optional embodiments, the protection layer 90 covers both the connection lines Z1 and the shading portion 61.

In the embodiments of the present application, the protection layer 90 may be provided as an monolithic structure, and can cover both the connection lines Z1 and the shading portion 61, which is helpful to enable the protection layer 90 to better cover the connection lines Z1. Meanwhile, the protection layer 90 is provided in different regions of the display panel, so that the influence of the presence of the protection layer 90 on the display uniformity can be reduced, and the display uniformity of the display panel can be improved.

A thickness of the protection layer 90 is also not limited in the embodiments of the present application. Optionally, the thickness of the protection layer 90 is W, and W satisfies 3 nm≤W≤300 nm. This design can reduce the influence of the protection layer 90 on the overall thickness of the display panel as much as possible while the protection need is met, which is helpful for the light and thin design of the display panel.

In some embodiments, as shown in FIG. 1 and FIG. 2, the display panel further includes a first encapsulation layer 71 positioned on a side of the first electrode layer 40 facing away from the substrate 10, the first encapsulation layer 71 includes a first encapsulation portion 711 provided correspondingly to the opening structure 21, and the protection layer 90 covers at least a part of the first encapsulation portion 711.

The first encapsulation layer 71 is positioned on the side of the first electrode layer 40 facing away from the substrate 10, this is, on a side of a light-emitting surface of the light-emitting structure 31. The first encapsulation layer 71 may encapsulate and protect the light-emitting structures 31. Due to the presence of the isolation structure 20, the manufactured first encapsulation layer 71 may include a plurality of first encapsulation portions 711 corresponding to the light-emitting structures 31 and positioned in the opening structures 21, and respective first encapsulation portions 711 may encapsulate the light-emitting structures 31 independently, thereby enhancing the encapsulation and protection effect for the light-emitting structures 31.

Further, the protection layer 90 also covers at least a part of the first encapsulation portion 711, and the presence of the protection layer 90 may further enhance the encapsulation and protection effect for the light-emitting structure 31. Material components of the first encapsulation layer 71 and the protection layer 90 are not limited in the embodiments of the present application. Illustratively, the first encapsulation layer 71 includes an inorganic material.

In some embodiments, the display panel further includes a second encapsulation layer 72 positioned on a side of the protection layer 90 facing away from the substrate 10.

The first encapsulation layer 71 and the second encapsulation layer 72 may be used jointly for encapsulation and protection, and optionally, the display panel further includes a third encapsulation layer 73 positioned on a side of the second encapsulation layer 72 facing away from the substrate 10, and the first encapsulation layer 71, the second encapsulation layer 72 and the third encapsulation layer 73 together constitute a thin film encapsulation structure. Accordingly, the risk of intrusion of water, oxygen and the like into the light-emitting structures 31 is further reduced, and the reliability of the display panel is improved. Material components of the second encapsulation layer 72 and the third encapsulation layer 73 are not limited in the embodiments of the present application. Optionally, the first encapsulation layer 71 and the third encapsulation layer 73 both include inorganic materials, and the second encapsulation layer 72 includes an organic material.

In addition to the difference in materials, the second encapsulation layer 72 further differs from the first encapsulation layer 71 in that the second encapsulation layer 72 is provided as a monolithic and continuous structure. On this basis, in the embodiments of the present application, the protection layer 90 is provided between the first encapsulation layer 71 and the second encapsulation layer 72, and since the protection layer 90 may be provided as an monolithic structure, the protection layer 90 can assist the first encapsulation layer 71 in limiting the position of the second encapsulation layer 72, and thereby improving the reliability of the encapsulation structure. Further optionally, the protection layer 90 includes an inorganic material, for example, the protection layer 90 includes silicon nitride, silicon oxide or silicon oxynitride, and the second encapsulation layer 72 includes an organic material.

Figure 9:
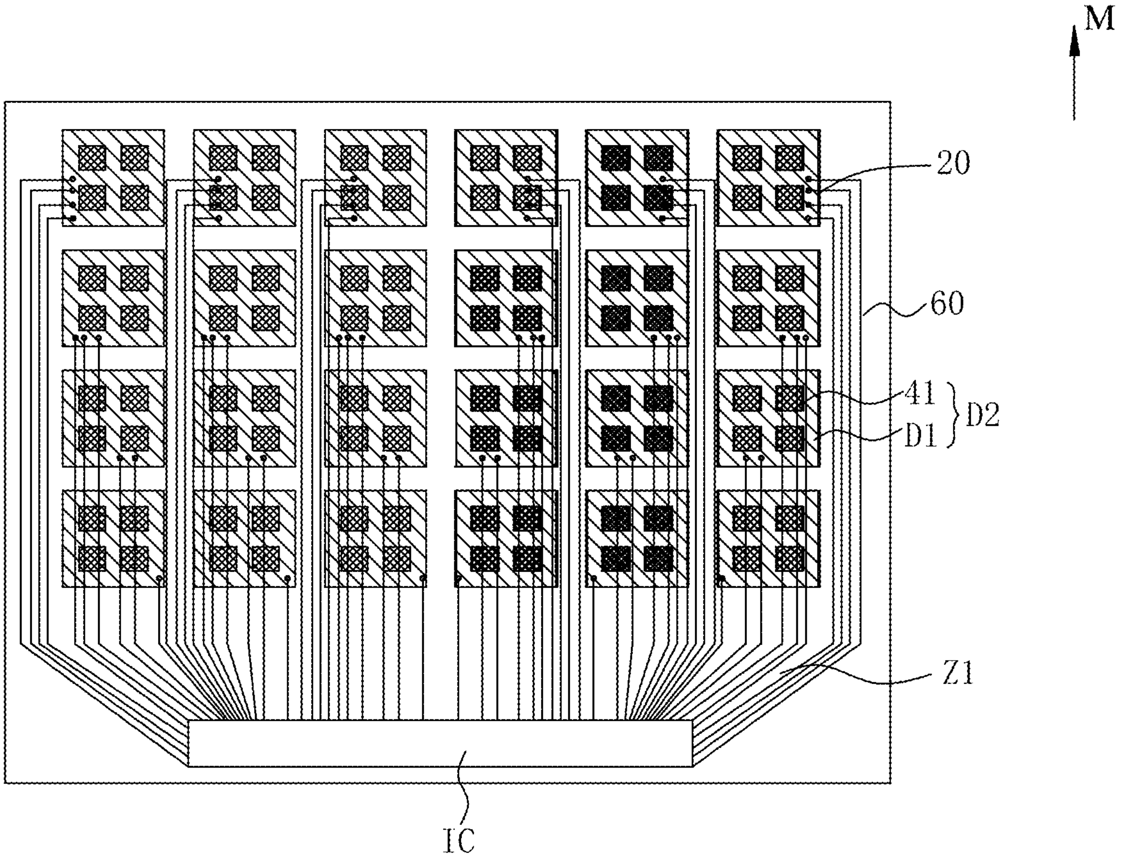
FIG. 9 is a schematic structural diagram of another display panel according to an embodiment of the present application.

In some embodiments, as shown in FIG. 9, the display panel further includes a driving chip IC. The connection lines Z1 are connected to the driving chip IC, and a number of connection lines Z1 corresponding to each isolation unit D1 tends to increase gradually along a direction M away from the driving chip IC.

The driving chip IC can transmit corresponding touch signals to the isolation units D1 through the connection lines Z1, and transmit corresponding power signals to the first electrodes 41 through the connection lines Z1 and the isolation units D1, so that time-divided and region-divided driving of the display function and touch function of the display panel can be achieved.

Further, at least some different ones of the isolation units D1 may have different distances from the driving chip IC, and on this basis, at least some different ones of the isolation units D1 may correspond to connection lines Z1 of different lengths, resulting in differences in resistances corresponding to different connection lines Z1. On this basis, under a condition that numbers of the connection lines Z1 corresponding to different touch units D2 are set to be the same, resistances of connection lines Z1 connected to different touch units D2 are different, so that the signal strengths received by different touch units D2 are different, and it is liable to a risk such as non-uniform display or poor touch.

In view of this, in the embodiments of the present application, numbers of connection lines Z1 corresponding to at least some different ones of the isolation units D1 are adjusted, so that a number of connection lines Z1 corresponding to each isolation unit D1 tends to increase gradually along the direction M away from the driving chip IC. That is, the farther a distance of an isolation unit D1 from the driving chip IC is, the greater the number of connection lines Z1 connected to the isolation unit D1 is. As such, differences in resistances of connection lines Z1 corresponding to different touch units D2 can be reduced, differences in signal strengths received by different touch units D2 can be reduced, and the display reliability and the touch reliability can be improved.

In some optional embodiments, a resistance of connection lines Z1 corresponding to some isolation units D1 is R1, a resistance of connection lines Z1 corresponding to some other isolation units D1 is R2, and R1 and R2 satisfy $-0.1 \leq (R1-R2)/R1 \leq 0.1$.

The "connection line(s) Z1 corresponding to an isolation unit D1" mentioned in the embodiments of the present application refers to connection line(s) Z1 electrically connected to the isolation unit D1. Under a condition that the isolation unit D1 is electrically connected to only one connection line Z1, a resistance of the connection line Z1 corresponding to the isolation unit D1 is a resistance of the single connection line Z1, and under a condition that the isolation unit D1 is electrically connected to a plurality of connection lines Z1, a resistance of the connection lines Z1 corresponding to the isolation unit D1 is a resistance of the plurality of connection lines Z1 connected in parallel.

In the embodiments of the present application, parameters such as numbers of connection lines corresponding to different isolation units D1 may be adjusted, so that differences in resistances of the connection lines Z1 corresponding to different isolation units D1 are not greater than 10%, thereby reducing differences in signal strengths received by different isolation units D1, and improving the display reliability and the touch reliability.

Further optionally, along the direction M away from the driving chip IC, the number of connection lines Z1 corresponding to touch units D2 positioned in an n-th row is a, the number of connection lines Z1 corresponding to touch units D2 positioned in a first row is b, n is a positive integer greater than 1, and a and b satisfy a:b=n:1.

Generally, a resistance corresponding to a single connection line Z1 is proportional to its length, and under a condition that a plurality of connection lines Z1 of the same length are connected in parallel, a corresponding total resistance is inversely proportional to the number of the connection lines Z1. Specifically, under a condition that a length of a single connection line Z1 corresponding to an isolation unit D1 positioned in the first row is L, a length of a single connection line Z1 corresponding to an isolation unit D1 positioned in an n-th row is nL, and further, a resistance of the single connection line Z1 corresponding to the isolation unit D1 positioned in the n-th row is n times of the resistance of the single connection line Z1 corresponding to the isolation unit D1 positioned in the first row.

On this basis, in the embodiments of the present application, the number of connection lines Z1 corresponding to isolation units D1 positioned in the n-th row is n times of the number of connection lines Z1 corresponding to isolation units D1 positioned in the first row, so that when other conditions are the same, resistances of a plurality of connection lines Z1 provided in parallel corresponding to touch electrodes in the n-th row may be the same or similar as resistances of connection lines Z1 corresponding to touch electrodes in the first row. As such, differences in resistances of connection lines Z1 corresponding to different isolation units D1 can be further reduced, differences in signal strengths received by different isolation units D1 can be reduced, and the display reliability and the touch reliability can be improved.

Figure 10:
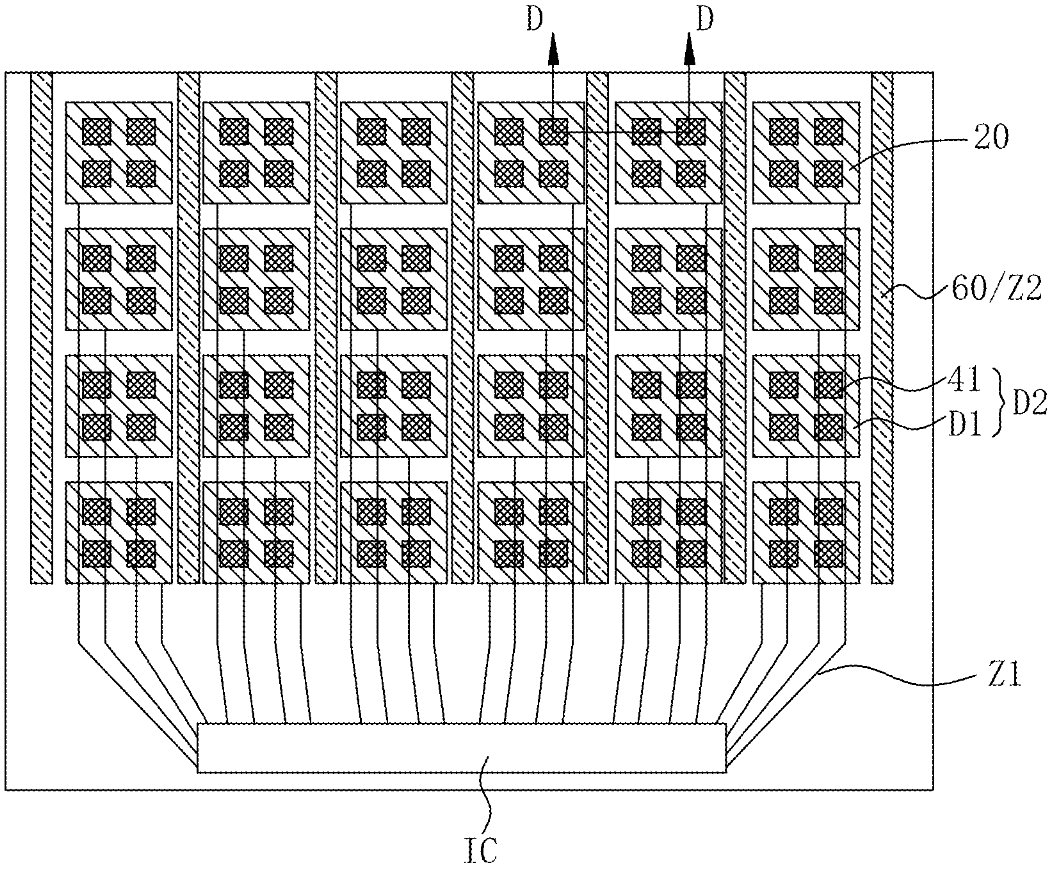
FIG. 10 is a schematic structural diagram of another display panel according to an embodiment of the present application.
Figure 11:
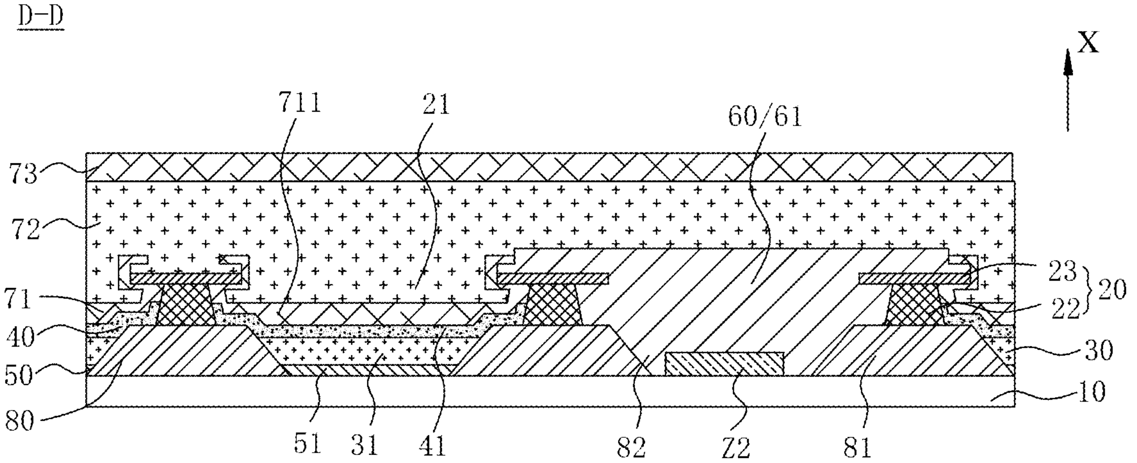
FIG. 11 is a schematic structural diagram of a sectional view at D-D in FIG. 10.

In some embodiments, as shown in FIG. 10 and FIG. 11, the display panel further includes a pixel definition layer 80 on a side of the isolation structure 20 facing the substrate 10, and the pixel definition layer 80 includes a pixel definition portion 81 and a pixel opening 82 encircled and formed by the pixel definition portion 81.

The pixel definition layer 80 includes the pixel definition portion 81 and the pixel opening 82, and the pixel opening 82 is provided correspondingly to an opening structure 21. Illustratively, an orthographic projection of the pixel opening 82 on the substrate 10 may be positioned within an orthographic projection of the opening structure 21 on the substrate 10, and a light-emitting structure 31 and a partial structure in a first electrode 41 may be positioned within the pixel opening 82. In some embodiments, the light adjustment portion 60 includes a reflective portion Z2 positioned on a side of the pixel definition portion 81 facing the substrate 10, and an orthographic projection of the reflective portion Z2 on the substrate 10 is at least partially positioned between orthographic projections of adjacent touch units D2 on the substrate 10.

The reflective portion Z2 may be used to reflect ambient light. Optionally, the reflective portion Z2 also includes a conductive material, and the reflective portion Z2 is positioned on a side of the pixel definition layer 80 facing the substrate 10, the reflective portion Z2 may be electrically connected to other conductive structures, or the reflective portion Z2 may not be electrically connected to other conductive structures, that is, during the use of the display panel, a specific signal may be transmitted in the reflective portion Z2, or there is no signal being transmitted in the reflective portion Z2, which is not limited in the embodiments of the present application.

Further, an orthographic projection of the reflective portion Z2 on the substrate 10 is at least partially positioned between orthographic projections of adjacent touch units D2 on the substrate 10, so that the light reflectivity corresponding to regions in the display panel between adjacent isolation units D1 can be adjusted by means of the reflective portion Z2, so as to reduce the differences in light reflectivity corresponding to the different regions, which is helpful to reduce the risk that the isolation units D1 are visible under a condition that the screen of the display panel is turned off. Material components of the reflective portion Z2 are not limited in the embodiments of the present application. Optionally, the reflective portion Z2 may include metal materials such as copper, aluminum, titanium and the like.

It should be noted that the embodiments of the present application are more applicable to a condition that the isolation units D1 are provided with reflective structure(s). The uniformity of the light reflectivity in regions between adjacent isolation units D1 can be adjusted by the reflective portion Z2, so as to reduce the risk that the touch units D1 are visible under a condition that the screen of the display panel is turned off. Optionally, the first isolation portion includes a light-transmitting material or a reflective material, and/or the second isolation portion includes a light-transmitting material or a reflective material. In some specific embodiments, the first isolation portion 22 includes a reflective material, and the second isolation portion 23 includes a light-transmitting material, for example, the material of the first isolation portion 22 is aluminium, and the material of the second isolation portion 23 is a light-transmitting metal oxide; alternatively, the first isolation portion 22 and the second isolation portion 23 both include reflective materials, for example, the material of the first isolation portion 22 is aluminium, and the material of the second isolation portion 23 is titanium.

In some embodiments, the display panel further includes a second electrode layer 50 positioned on a side of the light-emitting functional layer 30 facing the substrate 10, and the second electrode layer 50 includes a plurality of second electrodes 51 provided correspondingly to a plurality of light-emitting structures 31. The reflective portion Z2 is positioned within the second electrode layer 50 and is insulated from the second electrode(s) 51.

The first electrode(s) 41 and the second electrode(s) 51 jointly drive and control whether the light-emitting structure (s) 31 emit light or not, and on this basis, in the embodiments of the present application, the reflective portion(s) Z2 is provided on the same layer as the second electrode(s) 51, so that the influence of the presence of the reflective portion(s) Z2 on the overall thickness of the display panel can be reduced, which is helpful for the light and thin design of the display panel.

Further optionally, the reflective portion(s) Z2 and the second electrode(s) 51 include the same material, that is, both of them may be manufactured together in the same manufacturing process, so as to simplify the manufacturing process of the film layers in the display panel and improve the manufacturing efficiency of the display panel.

Alternatively, in other embodiments, the substrate 10 includes a metal layer, and the reflective portion(s) Z2 are provided on the metal layer. The metal layer included in the substrate 10 may be a metal layer where signal lines are positioned, for example, the metal layer includes data signal lines, reference voltage data lines, power signal lines, and the like.

Figure 12:
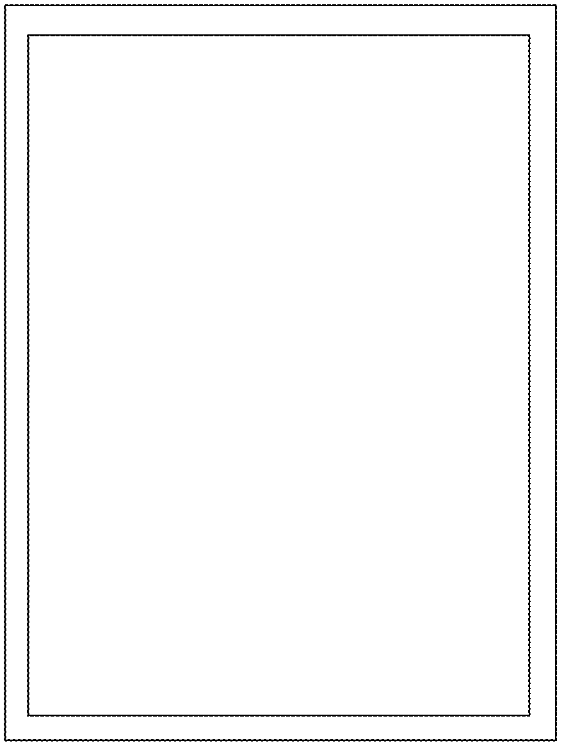
FIG. 12 is a schematic structural diagram of a display device according to an embodiment of the present application.

In a second aspect, as shown in FIG. 12, an embodiment of the present application provides a display device including the display panel according to any one of the previous embodiments.

It should be noted that the display device according to the embodiment of the present application has the beneficial effects of the display panel according to any one of the previous embodiments, and for details, reference should be made to the previous description of the beneficial effects of the display panel, which will not be repeated in the embodiment of the present application.

While the implementations of the present application are disclosed above, the foregoing is only for purpose of illustration of the implementations of the present application applied in the present application and is not intended to limit the present application. Modifications and variations in forms and details may be made by any person skilled in the art related to the present application, without departing from the gist and scope disclosed in the present application, and the protection scope of the present application is defined only by the scope of the appended claims.

The above provides only specific implementations of the present application, it is apparent to those skilled in the related art that other alternatives of the above connections may be obtained by referring to the corresponding processes in the foregoing method embodiments, which will not be repeated herein for the convenience and brevity of the description. It should be understood that the protection scope of the present application is not limited to this, and any person skilled in the art can easily conceive of various equivalent modifications or alternatives within the technical scope disclosed in the present application, and these modifications or alternatives should all be covered within the protection scope of the present application.

What is claimed is:

1. A display panel, comprising:

a substrate;

an isolation structure provided on a side of the substrate and comprising a plurality of isolation units provided at intervals, and the isolation units encircling and forming at least one opening structure;

a light-emitting functional layer provided on the side of the substrate and comprising a light-emitting structure corresponding to the opening structure;

a first electrode layer provided on a side of the light-emitting functional layer facing away from the substrate and comprising a first electrode corresponding to the opening structure; and a light adjustment portion provided on the side of the substrate, and an orthographic projection of the light adjustment portion on the substrate being at least partially positioned between orthographic projections of adjacent isolation units of the isolation units on the substrate.

2. The display panel according to claim 1, wherein the isolation structure comprises a first isolation portion and a second isolation portion stacked in sequence along a direction away from the substrate, and an orthographic projection of the first isolation portion on the substrate is positioned within an orthographic projection of the second isolation portion on the substrate; and the first isolation portion comprises a conductive material, and the first electrode is electrically connected to the first isolation portion.

3. The display panel according to claim 2, wherein the isolation structure further comprises a third isolation portion positioned on a side of the first isolation portion facing the substrate, and the third isolation portion comprises a conductive material and is electrically connected to the first isolation portion; and the first electrode is overlapped with the third isolation portion.

4. The display panel according to claim 1, wherein the display panel further comprises a plurality of connection lines, at least some different ones of the connection lines are electrically connected to different isolation units; and the connection lines are provided to contact the isolation structure.

5. The display panel according to claim 4, wherein the light adjustment portion comprises at least parts of the connection lines, and orthographic projections of at least parts of the connection lines on the substrate are positioned between the adjacent isolation units; and the orthographic projections of at least parts of the connection lines on the substrate overlap orthographic projections of the isolation units on the substrate.

6. The display panel according to claim 4, wherein the display panel further comprises dummy lines provided side by side with and insulated from the connection lines, and a distance between any two adjacent lines among the plurality of connection lines and the dummy lines provided side by side is identical;

the connection lines comprise power signal lines;

the first electrode is electrically connected to a corresponding isolation unit to form a touch unit, and the connection lines comprise touch signal lines; and the isolation units comprise at least one of a light-transmitting material and a reflective material.

7. The display panel according to claim 1, wherein the light adjustment portion comprises at least one shading portion, and an orthographic projection of at least a partial structure of the shading portion on the substrate is positioned between the orthographic projections of the adjacent isolation units on the substrate;

at least a part of the shading portion is positioned on a same film layer as the isolation structure;

at least a part of the shading portion is filled in a gap between the adjacent isolation units.

8. The display panel according to claim 7, wherein the display panel further comprises a plurality of connection lines, at least some different ones of the connection lines are electrically connected to different isolation units, and at least parts of the connection lines are positioned on a side of the shading portion facing the substrate;

a part of the shading portion is positioned on a side of the isolation structure facing away from the substrate;

an orthographic projection of the shading portion on the substrate covers an orthographic projection of the isolation structure on the substrate;

the isolation structure comprises a shading material; and the shading portion comprises a black organic material.

9. The display panel according to claim 7, wherein the display panel further comprises a plurality of connection lines, at least some of different ones of the connection lines are electrically connected to different isolation units, and at least parts of the connection lines are positioned on a side of the shading portion facing away from the substrate; and the shading portion includes at least one first via provided thereon, and at least some of the connection lines are connected to the isolation units through the first via.

10. The display panel according to claim 9, wherein the isolation structure comprises a first isolation portion and a second isolation portion stacked in sequence along a direction away from the substrate, an orthographic projection of the first isolation portion on the substrate is positioned within an orthographic projection of the second isolation portion on the substrate, the first isolation portion comprises a conductive material, and the first electrode is electrically connected to the first isolation portion; and the second isolation portion includes a second via provided thereon, the second via is connected to the first via, and at least some of the connection lines are electrically connected to the first isolation portion through the first via and the second via.

11. The display panel according to claim 9, wherein the display panel further comprises a protection layer positioned on a side of the connection lines facing away from the substrate;

the protection layer covers both the connection lines and the shading portion; and a thickness of the protection layer is W, and W satisfies 3 nm≤W≤300 nm.

12. The display panel according to claim 11, wherein the display panel comprises a first encapsulation layer that is positioned on a side of the first electrode layer facing away from the substrate, the first encapsulation layer comprises a first encapsulation portion provided correspondingly to the opening structure, and the protection layer covers at least a part of the first encapsulation portion.

13. The display panel according to claim 12, wherein the display panel further comprises a second encapsulation layer positioned on a side of the protection layer facing away from the substrate; and the protection layer comprises an inorganic material, and the second encapsulation layer comprises an organic material.

14. The display panel according to claim 9, wherein the display panel further comprise a driving chip, and the connection lines are connected to the driving chip;

a number of connection lines connected correspondingly to the isolation units tends to increase gradually along a direction away from the driving chip.

15. The display panel according to claim 14, wherein a resistance of connection lines corresponding to some of the isolation units is R1, a resistance of connection lines corresponding to other isolation units is R2, and R1 and R2 satisfy $-0.1 \leq (R1-R2)/R1 \leq 0.1$.

16. The display panel according to claim 1, wherein the light adjustment portion comprises at least one reflective portion positioned on a side of the isolation units facing the substrate, and an orthographic projection of the reflective portion on the substrate is at least partially positioned between the orthographic projections of the adjacent isolation units on the substrate.

17. The display panel according to claim 16, wherein the display panel further comprises a second electrode layer positioned on a side of the light-emitting functional layer facing the substrate, and the second electrode layer comprises a plurality of second electrodes corresponding to a plurality of light-emitting structures;

the reflective portion is positioned in the second electrode layer and is insulated from the second electrodes; and the reflective portion and the second electrodes comprise a same material.

18. The display panel according to claim 17, wherein the display panel further comprises a pixel definition layer positioned on a side of the isolation structure facing the substrate, and the pixel definition layer comprises a pixel definition portion and a pixel opening encircled and formed by the pixel definition portion, and a second electrode is exposed from a corresponding pixel opening;

the substrate comprises a metal layer, and the reflective portion is positioned in the metal layer; and the isolation units comprise a reflective material.

19. The display panel according to claim 1, wherein the isolation units and the light adjustment portion both include a shading material, or the isolation units and the light adjustment portion both include a reflective material.

20. A display device, comprising the display panel according to claim 1.

* * * * *